(12) United States Patent
Mak

(10) Patent No.: US 7,945,226 B2
(45) Date of Patent: May 17, 2011

(54) METHOD AND CIRCUIT FOR ADAPTIVE AUTOMATIC GAIN CONTROL

(75) Inventor: Gary Mak, Stittsville (CA)

(73) Assignee: Ciena Corporation, Linthicum, MD (US)

( * ) Notice: Subject to any disclaimer, the term of this patent is extended or adjusted under 35 U.S.C. 154(b) by 645 days.

(21) Appl. No.: 12/054,874

(22) Filed: Mar. 25, 2008

(65) Prior Publication Data

US 2009/0247105 A1    Oct. 1, 2009

(51) Int. Cl.
*H04B 1/06* (2006.01)

(52) U.S. Cl. ............. 455/232.1; 455/234.1; 455/234.2; 455/240.1; 455/250.1; 455/237.1; 375/345

(58) Field of Classification Search ............. 455/232.1, 455/234.1, 234.2, 240.1, 250.1, 237.1; 375/345
See application file for complete search history.

(56) References Cited

U.S. PATENT DOCUMENTS

| 7,103,335 | B2 * | 9/2006 | Hosomi ............... 455/234.1 |
| 7,245,654 | B2 * | 7/2007 | Chang et al. ........... 375/150 |
| 2005/0089123 | A1 * | 4/2005 | Spiegel ............... 375/345 |

OTHER PUBLICATIONS

Åström, Karl Johan, Fellow, IEEE, "Adaptive Feedback Control," *Proceedings of the IEEE*, vol. 75(2), pp. 185-217, (Feb. 1987).
Hanlon, Peter D. and Maybeck, Peter S., "Multiple-Model Adaptive Estimation Using a Residual Correlation Kalman Filter Bank," *IEEE Transactions on Aerospace and Electronics Systems*, vol. 36(2), pp. 393-406, (Apr. 2000).
Hang, C.C. and Sin, Kok Kee, "On-Line Auto Tuning of PID Controllers Based on the Cross-Correlation Technique," *IEEE Transactions on Industrial Electronics*, vol. 38(6), pp. 428-437, (Dec. 1991).

\* cited by examiner

*Primary Examiner* — Sanh D Phu
(74) *Attorney, Agent, or Firm* — Christopher & Weisberg, P.A.

(57) ABSTRACT

A method for adaptive automatic gain control and an automatic gain control circuit are provided. A predetermined waveform is injected into the automatic gain control circuit. A signal is sampled at at least one point in the automatic gain control circuit in which the sampled signal includes the injected predetermined waveform. A small-signal control characteristic is calculated using the sampled at least one signal. A determination is made as to whether the calculated small-signal control characteristic is valid. In the case of a valid determination, the calculated small-signal control characteristic is used to adjust the gain of the automatic gain control circuit.

20 Claims, 2 Drawing Sheets

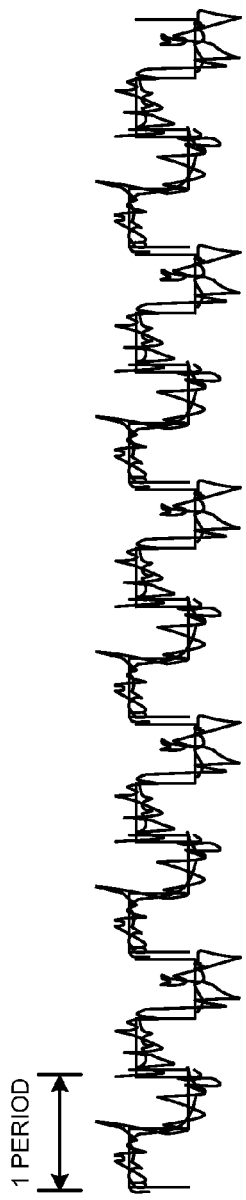
FIG. 2
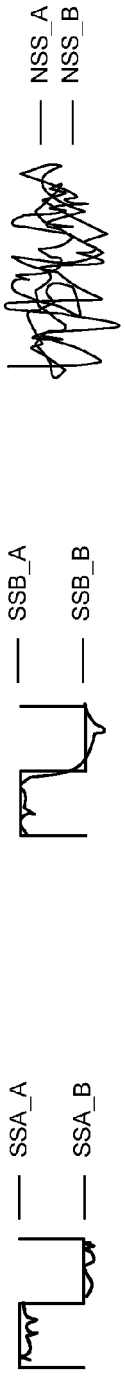
FIG. 3
FIG. 4
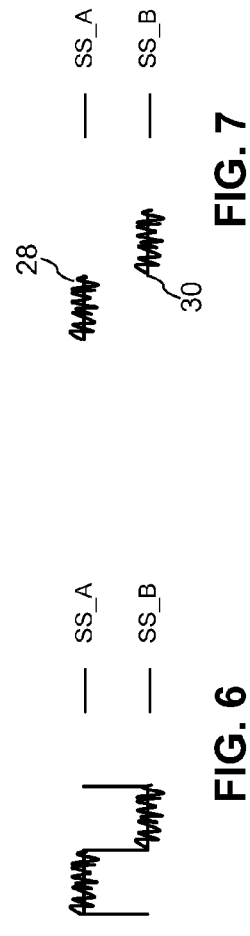
FIG. 5
FIG. 6
FIG. 7

METHOD AND CIRCUIT FOR ADAPTIVE AUTOMATIC GAIN CONTROL

CROSS-REFERENCE TO RELATED APPLICATION n/a

STATEMENT REGARDING FEDERALLY SPONSORED RESEARCH OR DEVELOPMENT n/a

FIELD OF THE INVENTION

The present invention relates to automatic gain control electronic circuits and in particular to a method and system that provides automatic gain control that quickly adapts to changes in the input signal level in a manner that is invariant to changes in the components in the circuit.

BACKGROUND OF THE INVENTION

Automatic gain control ("AGC") circuits are electronic amplification circuits that are used to maintain a constant output signal level in the face of widely varying input signal levels. This is accomplished by automatically adjusting the gain of the circuit based on the input signal level. These circuits typically use some form of feedback from the output to control the amplification level applied to the input signal. In the electrical domain, the power level is controlled with a variable gain amplifier ("VGA"). In the optical domain, the optical power level is controlled with a variable optical attenuator ("VOA").

Such circuits are used, for example, in optical receivers such as may be found in optical data communication network devices. In order operate at peak efficiency and at a minimum error rate, it is desirable to control the input power, both in the optical and electrical domains, to a level that is optimized for components and circuits downstream in the receiver. In other words, the received optical input signal must be conditioned to an optimized optical level and then again in the electrical domain to provide an optimized electrical output power level to downstream receiver components. Of course, such conditioning and optimization finds uses in many other implementations, and applicability to an optical receiver is merely exemplary.

While AGCs are generally known, existing circuits are often to slow to react to changes in the input signal. The result is that the output signal level becomes unstable and varies. The speed with which an AGC can adjust to changes in the input is referred to as "tracking bandwidth". If the tracking bandwidth is too small, the AGC is not able to maintain a constant output signal under dynamic input conditions. If the tracking bandwidth is too high, the output can become unstable due to instability in the feedback loop of the AGC. This problem can be particularly detrimental in high speed optical networks where even a brief variance in the output signal can impair the receiver's ability to properly recover and extract the received information. Component variation can impact the tracking bandwidth.

It is readily understood that not all components used in an electrical or optical circuit exhibit the exact same performance characteristics due to tolerance variations. For example, a particular integrated circuit type used as a component in an automatic gain control circuit can vary from one integrated circuit to the next. The result is that, although the same integrated circuit may be specified in an AGC design, the variances and tolerances among components can result in inconsistent performance from one AGC to another. Similarly, as components age, their performance characteristics can change. Using the integrated circuit example, as an integrated circuit in an AGC ages, the change in performance of the integrated circuit results in a change in performance and tracking bandwidth of the AGC as a whole.

In addition, temperature can impact tracking bandwidth because changes in operating environment temperature can impact the performance of circuit components. Because an AGC can be implemented in systems that may find installation in widely varied environments, it is desirable that the AGC maintain a constant tracking bandwidth regardless of the temperature of the operating environment. For example, an optical receiver may be exposed to an operating environment that is very hot in the summer and very cold in the winter. While technicians can be dispatched to periodically measure the performance of the AGC and then manually recalibrate the circuit, such manual effort is expensive, time consuming and often occurs after performance of the AGC has degraded. As such, it is desirable to have an AGC that can automatically adjust to variances in circuit components to maintain a constant tracking bandwidth, regardless of whether the variances result from the aging of those components over time or variances among components of a particular type from one component to another and regardless of the operating environment temperature.

In addition to variances in AGC circuit components impacting tracking bandwidth, input signal noise can also impact the performance of an AGC. As such, in addition to having to detect and adjust to ACG circuit component performance changes, whether due to aging, inconsistency among components or temperature, such detection often must be made in the face of input signal noise. As such it is also desirable to have an AGC that can maintain a constant tracking bandwidth in the face of input signal noise, whether electrical signal noise or optical noise such as may be present in optical receivers.

SUMMARY OF THE INVENTION

The present invention advantageously provides a method and circuit for automatic gain control. The automatic gain control method and circuit of the present invention advantageously automatically adapt to changes in circuit components, even in the face of a noisy input signal, whether the changes result from component-to-component variation, component aging or operating environment temperature.

In accordance with one aspect, the present invention provides a method for adaptive automatic gain control using an automatic gain control circuit. A predetermined waveform is injected into the automatic gain control circuit. A signal is sampled at at least one point in the automatic gain control circuit in which the sampled signal includes the injected predetermined waveform. A small-signal control characteristic is calculated using the sampled at least one signal. A determination is made as to whether the calculated small-signal control characteristic is valid. In the case of a valid determination, the calculated small-signal control characteristic is used to adjust the gain of the automatic gain control circuit.

In accordance with another aspect, the present invention provides an automatic gain control circuit for applying a gain to an input signal, in which the automatic gain control circuit has a programmable signal generator generating a perturbation signal having a selected waveform. At least one sampling sensor samples a signal at at least one point in the automatic gain control circuit. The sampled signal includes the perturbation signal. A loop controller controls the gain applied to the input signal. A master controller is in operative communication with the programmable signal generator, the at least one sampling sensor and the loop controller. The master controller calculates a small-signal control characteristic using the sampled at least one signal, determines whether the calculated small-signal control characteristic is valid, and in the case of a valid determination, uses the calculated small-signal control characteristic to control the loop controller to adjust the gain of the automatic gain control circuit.

In accordance with yet another aspect, the present invention provides a communication device in which the communication device receives an input signal and has an automatic gain control circuit for applying a gain to the input signal. The automatic gain control circuit has a programmable signal generator generating a perturbation signal having a selected waveform. At least one sampling sensor samples a signal at at least one point in the automatic gain control circuit. The sampled signal includes the perturbation signal. A loop controller controls the gain applied to the input signal. A master controller is in operative communication with the programmable signal generator, the at least one sampling sensor and the loop controller. The master controller calculates a small-signal control characteristic using the sampled at least one signal, determines whether the calculated small-signal control characteristic is valid, and in the case of a valid determination, uses the calculated small-signal control characteristic to control the loop controller to adjust the gain of the automatic gain control circuit.

BRIEF DESCRIPTION OF THE DRAWINGS

A more complete understanding of the present invention, and the attendant advantages and features thereof, will be more readily understood by reference to the following detailed description when considered in conjunction with the accompanying drawings wherein:

FIG. 2 is an exemplary waveform series taken by a sampling sensor and/or noise sampling sensor of the present invention;

FIG. 3 is an exemplary averaged waveform measured at a first sampling sensor of the present invention;

FIG. 4 is an exemplary averaged waveform measured at a second sampling sensor of the present invention;

FIG. 5 is an exemplary averaged waveform measured at a noise sampling sensor of the present invention;

FIG. 6 is another exemplary averaged waveform measured at a sampling sensor of the present invention; and FIG. 7 is a diagram of the waveform of FIG. 6 split into two parts.

DETAILED DESCRIPTION OF THE INVENTION

Figure 1:
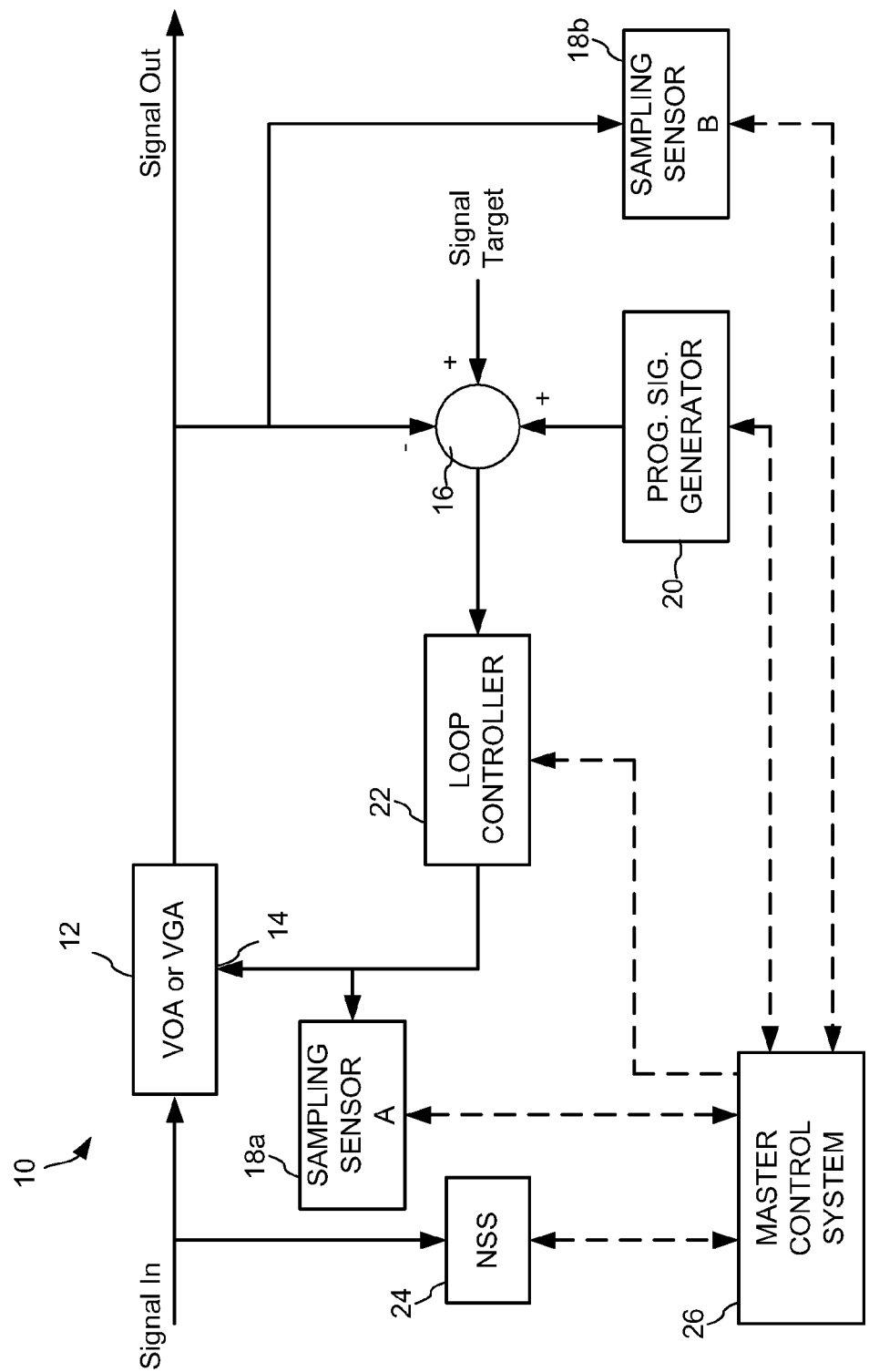
FIG. 1 is a diagram of an adaptive automatic gain control system constructed in accordance with the principles of the present invention.

Referring now to the drawing figures in which like reference designators refer to like elements, there is shown in FIG. 1, an adaptive automatic gain control system constructed in accordance with the principles of the present invention and designated generally as "10". Gain control system 10 preferably includes a variable gain amplifier ("VGA") or a variable optical attenuator ("VOA") 12. Of note, although the present invention is described in detail herein in the electrical domain, i.e., using a VGA, it is understood that the present invention can be implemented in the optical domain using a VOA and other optical sensors. Accordingly, the present invention is not limited solely to electrical gain control implementations and the description herein based on an electrical implementation is provided for convenience and solely for ease of understanding of the present invention. It is presumed that one of skill in the art can adapt the functions and circuits discussed herein in the electrical domain to corresponding optical domain implementations.

VGA 12 receives an input signal and generates a gain controlled output signal whose gain is based on control signal 14. The gain controlled output signal is fed back into summer 16 and is also sampled by sampling sensor B ("SSB") 18b. Summer 16 subtracts the value of the output signal from the added combination of a signal target, i.e., desired output level, and programmable signal generator 20. The output of summer 16 is input to loop controller 22, and the output of loop controller 22 is control signal 14. The output of loop controller 22 is also sampled by sampling sensor A ("SSA") 18a (sampling sensors A 18a and B 18b are referred to collectively herein as "sampling sensors 18"). In one embodiment, noise sampling sensor ("NSS") 24 samples the signal input to VGA 12. As shown by the dashed lines in FIG. 1, master control system ("MCS") 26 is in communication with sampling sensors 18, programmable signal generator 20, loop controller 22 and NSS 24. Such communication is used by MCS 26 to control sampling sensors 18, programmable signal generator 20, loop controller 22 and NSS 24 and/or to obtain data from sampling sensors 18, programmable signal generator 20, loop controller 22 and NSS 24. The function and operation of each of these elements of system 10 is described in detail below.

VGA 12 can be any variable gain amplifier (or VOA) that can generate an output signal whose gain is controlled by an input control signal. Of course, VGA 12 is selected based on the desired gain and signal range within the larger system, e.g., communication device (not shown). Similarly, summer 16 can be any summing device suitable to generate an output from a plurality of positive and/or negative inputs. For example, the summer 16 shown in FIG. 1 includes three inputs, two of which are positive and one of which is negative to provide a summed output to loop controller 22.

Programmable signal generator ("PSG") 20 generates a programmable waveform having a programmable amplitude, i.e., a programmable waveform shape of a programmable amplitude. Exemplary waveform shapes include but are not limited to sine waves, square waves, pseudo random binary sequence, etc. In the examples described herein, a square wave is described as the output of programmable signal generator 20, but the present invention is not limited to such. Programmable signal generator 20 triggers the perturbation waveform output depending on the type of waveform. For example, sine and square waves are triggered at twice the frequency used by sampling sensors 18 and NSS 24. Pseudo random binary sequences ("PRBS") are triggered at the fundamental frequency of sampling sensors 18 and NSS 24. The triggering of the waveform output by programmable signal generator 20 is controlled by MCS 26. As such, MCS 26 can maintain synchronization between the programmable signal generator 20 and waveform capturing and measuring elements such as sampling sensors 18 and NSS 24.

Sampling sensors 18 sample at the measurement points shown in FIG. 1 at a frequency much greater than the frequency of programmable signal generator 20. For example, the sampling frequency of sampling sensors 18 can be an integer multiple of the programmable signal generator 20 frequency. As noted above, the signal sampling by sampling sensors 18 is continuous and synchronous with the output of programmable signal generator 20 and is controlled by MCS 26. In other words, MCS 26 adjusts the trigger delay for phase alignment.

As is discussed below in detail with reference to FIG. 2, the samples collected by sampling sensors 18 are, in accordance with one embodiment, repeatedly averaged for a fixed time period of N or 2N samples depending on the waveform output by programmable signal generator 20. For example, in accordance with one embodiment, sine waves and square waves are averaged for the wave taken over one period while the PRBS waves are triggered at the fundamental frequency such that "0" and "1" bits are accumulated separately. The total number of time periods averaged can be user-configured or predetermined. In accordance with one embodiment, more than 500 time periods are averaged. The result is a sampling sensor captured waveform with a greatly reduced noise component.

NSS 24 is functionally the same as sampling sensors 18, but is placed with system 10 as to sample the input signal. In addition, as is discussed below in detail, the processing of the outputs of sampling sensors 18 differs from the processing of the output of NSS 24.

In accordance with one embodiment, loop controller 22 can be any integral loop controller known in the art. For example, a loop controller having an operating function $H(jf)=f_0K_0/jfK$ where $f_0$ is the loop tracking bandwidth, K is the small-signal control characteristic of VGA 12, $K_0$ is the scaling factor, f is the frequency and j is the sqrt (−1).

In general, system 10 is a digital sampling system which generates and captures waveforms in time in order to factor out noise and factor in changing parameters that can adversely impact gain stability such as temperature, component age and other environmental factors. The operation of system 10 is described below in detail.

Average waveform calculation performed by sampling sensors 18 and NSS 24 is described with reference to FIGS. 2-5. FIG. 2 shows an exemplary waveform series taken by a sampling sensor 18 and/or noise sampling sensor 24 of the present invention. FIG. 2 shows a time series of 10 noisy square wave periods assuming that programmable signal generator 20 outputs a square wave. Of note, the individual samples S (1) . . . S(2N) are not shown in FIG. 2. Rather, for ease of understanding, the waveform shown in FIG. 2 is drawn as a continuous waveform. FIG. 3 shows an example of an averaged waveform over the 10 periods such that the averaged waveform exhibits greatly reduced noise. Specifically, each point in the averaged waveform results from averaging the same point from each of the 10 periods (in this illustrative example), e.g. the first point in the averaged waveform is the average of the first points in each of the 10 periods. The signal to noise ratio ("SNR") in this case is improved by 10 dB. Averaging more periods (than 10) results in even more SNR improvement.

FIG. 3 shows an exemplary averaged waveform sampled by sampling sensor A 18a in which SSA_A represents the high point of the underlying square wave and SSA_B represents the low point of the underlying square wave. Similarly, FIG. 4 is an exemplary sample taken by sampling sensor B 18b in which SSB_A represents the high point of the underlying square wave and SSB_B represents the low point of the underlying square wave. FIG. 5 shows an exemplary averaged noise waveform sampled by NSS 24 in which NSS_A represents the approximate high value of the underlying sampled waveform and NSS_B represents the approximate low value of the sampled waveform.

MCS 26 performs control and calculation instructions for system 10. MCS 26 can be implemented as part of the same integrated circuit as other devices within system 10, or can be a stand-alone device engaged in electrical communication with the other elements of system 10, as discussed and described herein. MCS 26 instructs programmable signal generator 20 as to which waveform type and amplitude to generate to meet the requirements of narrow-band noise rejection or broadband noise immunity. Such pattern selection can be done once, e.g. during configuration, or adaptively during loop operation, e.g. while in service. The types and amount of different patterns can be chosen by the system designer to meet these requirements.

Further, it is contemplated that MCS 26 can include artificial intelligence such that MCS 26 initially instructs programmable signal generator 20 to use a default pattern but can then change the pattern used by programmable signal generator 20 based on system parameters. For example, the initial default pattern can use a sine wave at frequency $f_1$ because there is no signal at that frequency within the actual input signal to VGA 12. However, if the input signal ultimately includes a significant component at $f_1$, a problem downstream on the output signal will result because the injected sine wave will interfere with the same frequency at the input signal and thereby result in an inaccurate output signal. As such, master control system 26 can change the frequency of programmable signal generator 20 from $f_1$ to $f_2$ or can even change the waveform type. Such might happen in a scenario where sampling sensors 18 and/or NSS 24 can't make a good measurement. In such case, MCS 26 can adjust the frequency and/or waveform type to allow sampling sensors 18 and NSS 24 to obtain a good measurement.

As noted above, MCS 26 also controls a relative time delay trigger between programmable signal generator 20, sampling sensors 18 and NSS 24, and optimizes delays for the best performance. MCS 26 also robustly calculates the small-signal control characteristic of VGA 12 using the sampling sensor 18 data and determines whether the measurement is valid based on the processing of the NSS 24 data. In other words, MCS 26 can calculate the waveform of VGA 12 and can determine when an accurate measurement cannot be obtained. In accordance with one aspect of the invention, as discussed below, MCS 26 can optionally attempt to correct the small-signal control characteristic to allow for valid measurements. In accordance with another embodiment, if no NSS 24 is present, the measurement made by master control system 26 can determine whether a measurement is valid by processing sampling sensor data and estimating the signal to noise ratio.

MCS 26 also updates loop controller 22 to adaptively compensate for variations in the small-signal control characteristic of VGA 12. In that regard, MCS 26 can detect the saturation of the control characteristic of VGA 12 via the measured small-signal control characteristic. In other words, MCS 26 can determine when it is instructing loop controller 22 to take some action that loop controller 22 cannot take. Loop controller 22 is updated by MCS 26 and may take appropriate action such as enabling anti-windup.

MCS 26 performs two further functions. First, MCS 26 can self-test system 10 by measuring the rise and fall times of the averaged waveform to confirm proper loop operation. To perform such a function, a static test signal is applied to the input of VGA 12. Second, in operation, MCS 26 minimizes the additive noise of the programmable signal generator 20 that is super imposed on the automatic gain controlled loop formed by summer 16, loop controller 22 and VGA 12 by controlling PSG 20 to a target, i.e. maximum peak-to-peak at sampling sensors 18. In other words, MCS 26 controls programmable signal generator 20 such that just enough signal to be able to make a measurement is injected into the AGC loop as a perturbation signal. Each of the functions described above with respect to MCS 26 are described in detail with reference to one or more of FIGS. 3-6. Of note, each of the functions described herein assume that loop controller 22 is an integral controller and the perturbation waveform generated by programmable signal generator 20 is a square wave.

Small-Signal Control Characteristic Validity

MCS 26 calculates the small-signal control characteristic, K, of VGA 12 using data captured by sampling sensors 18 and optionally, in one embodiment NSS 24. MCS 26 determines whether the small-signal control characteristic is valid by processing the data captured by NSS 24. In the case where the measurement is invalid, MCS 26 can, in accordance with one embodiment, attempt to correct K to calculate a valid small-signal control characteristic. The small-signal control characteristic of VGA 12 is generally defined by:

$$K=(SSB\_A-SSB\_B)/(SSA\_A-SSA\_B).$$

In accordance with the present invention, MCS 26 determines that the calculated small-signal control characteristic signal is valid if (1) an expected maximum of a dither signal based on a first averaged sample waveform taken by sampling sensor A 18*a* and sampling sensor B 18*b* is greater than a minimum of the dither signal, and (2) a relative error due to noise at the input to the automatic gain control circuit, e.g., the noise sampled by NSS 24 is less than an allowed error relative to the normalized dither amplitude. In this case, the normalized noise at the input to the AGC circuit is ABS(NSS_A−NSS_B)/(NSS_A+NSS_B) and the normalized dither amplitude is defined as ABS(SSA_A−SSA_B)/(SSA_A+SSA_B). In other words, if (A) the noise at the input to the control loop defined by VGA 12, summer 16 and loop controller 22 is not so large that it causes the expected maximum of the dither signal to be less than the minimum of the dither signal and (B) the relative error due to the noise at the input to the control loop is less than allowed error relative to the normalized dither amplitude, the measurement K is valid. From an equation standpoint, item (A) is defined by (SSB_A−SSB_B)>0 and (SSA_A−SSA_B)>0, and item (B) by ABS(NSS_A−NSS_B)/(NSS_A+NSS_B)<threshold_factor*ABS (SSA_A−SSA_B)/(SSA_A+SSA_B), where 0<thres-hold_factor<1.

Correction of Calculated Small-Signal Control Characteristic

As noted above, in the case of the determination by MCS 26 that the calculated small-signal control characteristic is invalid, MCS 26 can correct the characteristic. In such case, correction is accomplished by (1)estimating an initial small-signal control characteristic K', where K' is defined as K'=(SSB_A−SSB_B)/(SSA_A−SSA_B), and (2) calculating the next estimate of the small-signal control characteristic such that the next estimate is based on the previous estimate, taking into account noise sampled by NSS 24. The equation defining the next estimate, K, is defined as K=(SSB_A−SSB_B)/(SSA_A−SSA_B−(NSS_A−NSS_B)/K'). The next estimate calculation is repeated a predetermined number of times, e.g., 10. In this manner, the small-signal control characteristic K used as input to loop controller 22 can be corrected to allow for a valid small-signal control characteristic calculation by MCS 26, even if the measurement is originally determined to be invalid.

Small-Signal Control Characteristic Validity Determination in Absence of NSS

In accordance with another embodiment, it is contemplated that certain implementations may not employ the use of NSS 24. In such case, where no NSS 24 is present, the determination as to whether the small-signal control characteristic measurement is valid can be made based on the data obtained by sampling sensors 18 such that signal-to-noise ratios ("SNR") are estimated and evaluated. Referring to FIG. 6, sampling sensor waveform data, e.g. sampled data from one of sampling sensors 18, is processed by splitting the waveform data into two pieces, shown in FIG. 7 as SS_A 28 and SS_B 30, and performing fast fourier transforms ("FFT") on the individual data sets corresponding to SS_A 28 and SS_B 30. The SNR of each of the two pieces can be determined from the maximum value relative to the noise. In such case, if the SNR corresponding to SS_A 28 and the SNR corresponding to SS_B 30 are greater than a predetermined minimum SNR value small-signal measurement K is considered valid. It is noted that there are many techniques to analyze the signal to noise ratio of a data set. As such, the use of a FFT is merely exemplary and the present invention is not limited to such.

Active Loop Controller Compensation and Saturation Detection

MCS 26 can update loop controller 22 to adaptively compensate for variations in the small-signal control characteristic of VGA 12. In such case, the compensation function is given by $f_o*K_o/K$=constant. In accordance with the present invention, MCS 26 can also detect saturation of the control characteristic of the VGA 12 based on the calculated small-signal control characteristic. In such case, MCS 26 can enable an anti-windup function to prevent changes to the control signal provided by loop controller 22 to VGA 12.

PSG Pattern Selection

As noted above, MCS 26 chooses the PSG 20 waveform pattern to meet the requirements of narrow-band noise rejection or broadband noise immunity in an adaptive manner during active operation. In accordance with this function, MCS 26 can keep track of the number of times that the small-signal control characteristic K has been found to be invalid. If the small-signal control characteristic has been invalid more than a predetermined number of times, MCS 26 can instruct PSG 20 to change the waveform, e.g. switch to a sine waveform, different sine wave frequency, switch to PRBS, etc.

PSG Peak-to-Peak Value Control

MCS 26 can also minimize the additive noise of the perturbation waveform superimposed by PSG 20 on the automatic gain control loop output by controlling PSG 20 to a target, i.e. maximum, peak-to-peak at sampling sensors 18. For example, if (SSB_A−SSB_B)>maximum target amplitude, decrease PSG 20 waveform amplitude. If (SSB_A−SSB_B)<minimum target amplitude, increase PSG 20 waveform amplitude.

Trigger Cross-Correlation

MCS 26 also can control the relative time delay triggers among sampling sensors 18 and NSS 24 and programmable signal generator 20 to maximize the signal cross-correlation between these devices. Cross-correlation in this case refers to cross-correlation of the averaged waveform of a sampling sensor 18 or NSS 24 with the programmable signal generator 20 waveform. In other words, the delays for sampling sensors 18 and NSS 24 are adjusted so that cross-correlation with the triggering of the perturbation waveform from programmable signal generator 20 is maximized. Such adjustment can be performed, for example, at calibration, or can be periodically performed.

Self Testing

It is also contemplated that MSC 26 can be configured to perform a self test of system 10 by measuring the rise/fall times of the averaged waveform sampled by SS B 18*b* to confirm proper operation of the control loop, i.e., proper operation of system 10. In one example, programmable signal generator 20 is set to output a square wave. Small-signal control characteristic K is measured and $K_o$ is set equal to K. The rise and fall time is calculated based on the average waveform sampled at SS B 18$b$ and the average waveform is numerically fit to an ideal model using the rise/fall time as the best-fit parameter. If the rise/fall time is less than a predetermined number, for example less than $0.35/f_o$, system 10 passes the self-test.

In accordance with the present invention, a system for an automatic gain control circuit is provided which advantageously adjusts to changes in component differences, aging, and the like while still allowing precise gain control, such as may be found in a piece of communication equipment. In such case, the communication equipment can be equipped with an automatic gain control circuit that applies gain to the input signal where this automatic gain control circuit includes a programmable signal generator 20, as discussed above, two sampling sensors 18, a loop controller 22 and a MCS 26 engaged in operative communication with the above-described devices. In this case, the MCS 26 calculates a small-signal control characteristic using samples taking by sampling sensors 18. MCS 26 determines whether the calculated small-signal control characteristic is valid and, where the determination is made that the calculated small-signal control characteristic is valid, MCS 26 uses the calculated small-signal control characteristic to control loop controller 20 to adjust the gain of the automatic control circuit, such as by adjusting the gain of VGA 12.

The present invention can be realized in hardware, software, or a combination of hardware and software. Any kind of computing system, or other apparatus adapted for carrying out the methods described herein, is suited to perform the functions described herein.

A typical combination of hardware and software could be a specialized or general purpose computer system having one or more processing elements and a computer program stored on a storage medium that, when loaded and executed, controls the computer system such that it carries out the methods described herein. The present invention can also be embedded in a computer program product that comprises all the features enabling the implementation of the methods described herein, and which, when loaded in a computing system is able to carry out these methods. Storage medium refers to any volatile or non-volatile computer readable storage device.

Computer program or application in the present context means any expression, in any language, code or notation, of a set of instructions intended to cause a system having an information processing capability to perform a particular function either directly or after either or both of the following a) conversion to another language, code or notation; b) reproduction in a different material form. In addition, unless mention was made above to the contrary, it should be noted that all of the accompanying drawings are not to scale. Significantly, this invention can be embodied in other specific forms without departing from the spirit or essential attributes thereof, and accordingly, reference should be had to the following claims, rather than to the foregoing specification, as indicating the scope of the invention.

It will be appreciated by persons skilled in the art that the present invention is not limited to what has been particularly shown and described herein above. In addition, unless mention was made above to the contrary, it should be noted that all of the accompanying drawings are not to scale. A variety of modifications and variations are possible in light of the above teachings without departing from the scope and spirit of the invention, which is limited only by the following claims.

What is claimed is:

1. A method for automatic gain control using an automatic gain control circuit, the method comprising:
   injecting a predetermined waveform into the automatic gain control circuit;
   sampling a signal at at least one point in the automatic gain control circuit, the sampled signal including the injected predetermined waveform;
   calculating a small-signal control characteristic using the sampled at least one signal;
   determining whether the calculated small-signal control characteristic is valid; and
   in the case of a valid determination, using the calculated small-signal control characteristic to adjust a gain of the automatic gain control circuit.

2. The method of claim 1, wherein injecting the predetermined waveform includes:
   selecting the predetermined waveform; and
   controlling the predetermined waveform to a target peak-to-peak value at at least one of the points of signal sampling in the automatic gain control circuit.

3. The method of claim 1, wherein in the case of a determination that the calculated small-signal control characteristic is invalid, the method further comprising correcting the small-signal control characteristic.

4. The method of claim 3, wherein correcting the small-signal control characteristic includes:
   (a) estimating an initial small-signal control characteristic;
   (b) calculating a next estimate of the small-signal control characteristic, the next estimate being based on a previous estimate of the small-signal control characteristic, including a sampled noise signal taken at an input to the automatic gain control circuit; and
   (c) repeating step (b) a predetermined number of times.

5. The method of claim 1, wherein the small-signal control characteristic is based on a first average sampled waveform taken at a first point in the automatic gain control circuit and a second average sampled waveform taken at a second point in the automatic gain control circuit.

6. The method of claim 1, wherein the small-signal control signal is determined to be valid if:
   an expected maximum of a dither signal based on a first average sampled waveform taken at a first point in the automatic gain control circuit and a second average sampled waveform taken at a second point in the automatic gain control circuit is greater than a minimum of the dither signal; and
   a relative error due to noise at an input to the automatic gain control circuit is less than an allowed error relative to the dither signal.

7. The method of claim 1, wherein the small-signal control signal is determined to be valid if a first signal-to-noise ratio ("SNR") of a first part of an average of a plurality of samples of the sampled signal and a second signal-to-noise ratio ("SNR") of a second part of the average of the plurality of the sampled signal are greater than a predetermined value.

8. An automatic gain control circuit for applying a gain to an input signal, the automatic gain control circuit comprising:
   a programmable signal generator, the programmable signal generator generating a perturbation signal having a selected waveform;
   at least one sampling sensor, the at least one sampling sensor sampling a signal at at least one point in the automatic gain control circuit, the sampled signal including the perturbation signal;

a loop controller, the loop controller controlling the gain applied to the input signal; and a master controller in operative communication with the programmable signal generator, the at least one sampling sensor and the loop controller, the master controller:

calculating a small-signal control characteristic using the sampled at least one signal;

determining whether the calculated small-signal control characteristic is valid; and in the case of a valid determination, using the calculated small-signal control characteristic to control the loop controller to adjust the gain of the automatic gain control circuit.

9. The automatic gain control circuit of claim 8, further including a variable gain amplifier ("VGA") receiving the input signal and being in electronic communication with the loop controller, a gain of the VGA being based on a control signal received from the loop controller.

10. The automatic gain control circuit of claim 9, wherein the master controller further:

detects a saturation of a control characteristic of the VGA based on the calculated small-signal control characteristic; and enables an anti-windup function to prevent changes to the control signal.

11. The automatic gain control circuit of claim 8, further including a variable optical attenuator receiving the input signal and being in communication with the loop controller, a gain of the variable optical attenuator being based on a control signal received from the loop controller.

12. The automatic gain control circuit of claim 8, wherein the master controller further performs a self-test of the automatic gain control circuit, the self-test including measuring rise times and fall times of an averaged waveform sampled by at least one sampling sensor.

13. The automatic gain control circuit of claim 8, wherein in the case of a determination that the calculated small-signal control characteristic is invalid, the master controller corrects the small-signal control characteristic.

14. The automatic gain control circuit of claim 13, wherein to correct the small-signal control characteristic, the master controller:

(a) estimates an initial small-signal control characteristic;

(b) calculates a next estimate of the small-signal control characteristic, the next estimate being based on a previous estimate of the small-signal control characteristic, including a sampled noise signal taken by at least one sampling sensor; and (c) repeats step (b) a predetermined number of times.

15. The automatic gain control circuit of claim 8, wherein the small-signal control characteristic is based on a first average sampled waveform taken by a first sampling sensor at a first point in the automatic gain control circuit and a second average sampled waveform taken by a second sampling sensor at a second point in the automatic gain control circuit.

16. The automatic gain control circuit of claim 8, further including a noise sampling sensor coupled to the input signal, wherein the small-signal control signal is determined to be valid by the mater controller if:

an expected maximum of a dither signal based on a first average sampled waveform taken by a first sampling sensor at a first point in the automatic gain control circuit and a second average sampled waveform taken by a second sampling sensor at a second point in the automatic gain control circuit is greater than a minimum of the dither signal; and a relative error due to noise sampled by the noise sensor is less than an allowed error relative to the dither signal.

17. The automatic gain control circuit of claim 8, wherein the small-signal control signal is determined to be valid by the master controller if a first signal-to-noise ratio ("SNR") of a first part of an average of a plurality of samples of the sampled signal and a second signal-to-noise ratio ("SNR") of a second part of the average of the plurality of the sampled signal are greater than a predetermined value.

18. The automatic gain control circuit of claim 8, wherein the master controller further:

monitors sample measurements made by the at least one sampling sensor;

detects an inability of the at least one sampling sensor to capture a valid sample; and causes the programmable signal generator to change the perturbation waveform the inability of the at least one sampling sensor to capture a valid sample is detected.

19. The automatic gain control circuit of claim 8, further including a noise sampling sensor coupled to the input signal, wherein the master controller further:

controls relative time delay triggers to the programmable signal generator, the at least one sampling sensor and the noise sampling sensor to maximize signal cross correlation between the programmable signal generator, the at least one sampling sensor and the noise sampling sensor.

20. A communication device, the communication device receiving an input signal, the communication device comprising:

an automatic gain control circuit for applying a gain to the input signal, the automatic gain control circuit comprising:

a programmable signal generator, the programmable signal generator generating a perturbation signal having a selected waveform;

a first sampling sensor, the first sampling sensor sampling a signal at first point in the automatic gain control circuit, the sampled signal including the perturbation signal;

a second sampling sensor, the second sampling sensor sampling the signal at a second point in the automatic gain control circuit, the sampled signal including the perturbation signal;

a loop controller, the loop controller controlling the gain applied to the input signal; and a master controller in operative communication with the programmable signal generator, the first and the second sampling sensors and the loop controller, the master controller:

calculating a small-signal control characteristic using the samples taken by the first and the second sampling sensors;

determining whether the calculated small-signal control characteristic is valid; and in the case of a valid determination, using the calculated small-signal control characteristic to control the loop controller to adjust the gain of the automatic gain control circuit.

* * * * *